INVENTORS
BOYD CORNELISON
MILTON K. MACK
BY Stevens, Davis, Miller & Mosher
ATTORNEYS

METHOD FOR MAKING SEMICONDUCTOR DEVICES

Filed April 25, 1958

INVENTORS
BOYD CORNELISON
MILTON K. MACK
BY Stevens, Davis, Miller & Mosher
ATTORNEYS INVENTORS
BOYD CORNELISON
MILTON K. MACK
BY Stevens, Davis, Miller & Mosher
ATTORNEYS United States Patent Office 2,970,896
Patented Feb. 7, 1961

2,970,896

METHOD FOR MAKING SEMICONDUCTOR DEVICES

Boyd Cornelison, Dallas, and Milton K. Mack, Garland, Tex., assignors to Texas Instruments Incorporated, Dallas, Tex., a corporation of Delaware Filed Apr. 25, 1958, Ser. No. 730,997

11 Claims. (Cl. 41—43)

The present invention relates to a novel and improved method for the precision masking areas of a semiconductor structure with an etch-resistant material preparatory to etching the semiconductor structure whereby precisely defined areas are protected from the etchant. More particularly, the invention relates to an improved method for precision masking areas of any shape and especially minute and/or intricately shaped areas on the surface of a semiconductor body for the purpose mentioned.

Thus far it has not been possible to achieve any appreciable degree of precision in the etching of precisely defined areas on the surface of a body of semiconductor material because of the problems inherent in the masking techniques and materials found in general use. Whereas the above is valid as regards to areas on a semiconductor body of any size and shape, it is particularly true with respects to minute and/or intricately or irregularly shaped areas.

The following is illustrative of the problems encountered in the manufacture of semiconductor devices requiring precision masking. One of the principal characteristics desired to be attained or achieved in semiconductor devices, and in particular, transistors, is high frequency response. This is accomplished, for example, in a diffused junction transistor by etching away the surface of the transistor to a depth below the diffused junction except for a minute area. This minute area must be large enough to accommodate the necessary transistor contacts, but should include no excess or parasitic areas. One of the principal techniques presently employed to achieve the necessary masking required to accomplish this precision etching step is to apply by hand a liquid solution of a suitable masking composition, such as polyethylene dissolved in xylene, to coat the area desired to be protected. This technique is carried out by means of a very fine brush or wire and is conducted under microscopic observation. The accuracy with which the coating is applied depends upon the skill of the technician and the character of the composition being used as the mask. Since a liquid solution is usually employed, a certain amount of flow will be present and it is impossible to coat completely the contacts and yet confine the coating to the precise area desired to be masked and protected. Hence, a substantial proportion of the area masked is excess or parasitic area. A further disadvantage of this technique stems from the fact that a reasonable drying time is necessary and hence ensuing operations are delayed at least for this drying period, thus increasing the cost of production. Further difficulties involve the necessity of dying the masking composition so that it may be visually observed through a microscope and maintaining the solution of masking material at a desirable viscosity prior to its application in order to obtain optimum flow characteristics. Additionally, masks of this type are frequently difficult to remove and the cleaning solvent, usually carbon tetrachloride, often leaves a residue that requires still a further cleaning step to remove it.

A further technique which has been used particularly in the masking of circular areas on a semiconductor body preparatory to etching involves the use of a wax-like material which is placed on the area to be masked either in a solid or liquid state. If placed on the area in a solid state, it is subjected to heat until it melts and flows over the area to be protected. When the wax-like material completely covers the area, it is cooled and transformed into a solid state. A mask is produced by this means which resists attack by the etching fluid used in the subsequent treatment. The principal disadvantage of this technique is the inability to freeze instantaneously the wax-like material at the precise moment it completely encompasses the area desired. Further, the wax-like material may coat one portion of the area more quickly than other portions and thus may overflow and coat areas not desired to be masked during the time that the remaining portions of the desired area are being coated. Hence, excess and parasitic areas are nearly always included in the final coated area by this method as well.

Essentially all prior techniques for masking have relied upon hand operations and essentially consist of depositing material onto the contacts as a liquid or a solid to be liquidified at which time it will flow and coat the area desired to be masked.

In contra-distinction to the above described techniques presently employed, this invention provides a new and unusual method whereby the precision masking of areas of a semiconductor body is for the very first time brought into the realm of practicability.

This precision masking is achieved in one form of the invention by depositing masking material onto the surface of the semiconductor body from the vapor state and blanking out the areas on the surface of the semiconductor body desired to be left free from the masking material. This constitutes a radical departure from the techniques now in use and makes it possible to eliminate the hand masking through the adoption of mechanization techniques for this step in the manufacture of semiconductor devices. A further aspect of the present invention is the discovery that sulfur has unusual and unexpected properties when used as a masking material. Accordingly, it is within the purview of the present invention to lay claim to applying a sulfur coating to a semiconductor body to mask precisely a defined area of a semiconductor body during an etching treatment in view of the highly unobvious and unexpected results which are obtained when using this particular material. The sulfur may be applied in any manner whatsoever, so long as a substantially non-porous coating results. Hence, the sulfur may be vapor deposited, coated on as a liquid, paste, etc., or even applied in the solid state. In some instances, further treatment may be desirable such as heating the sulfur coating to solidify the same and reduce porosity.

Accordingly, it is a principal object of the present invention to provide an improved unique and commercially practical method for precision masking areas of a semiconductor structure whereby the structure can be precision etched.

It is a further object of the present invention to provide a method for masking an area on a semiconductor body that comprises applying a coating of sulfur on the particular area thereby obtain highly unusual and unexpected results including easy removal of the masking material by sublimation.

It is a further object of the present invention to provide a new and different method for masking areas of transistors which lends itself well to the mechanization and even automation thereby eliminating errors due to human factors which are difficult to detect, predict, control and correct, thus providing more consistent results than are obtained by hand masking techniques or by masking techniques wherein human factors are relied upon to control the process.

It is a still further object of the present invention to provide a new and unusual method for masking transistor devices whereby the devices can be produced commercially at very low cost and in a more expedient and efficient manner than would be the case if produced using techniques previously known and used.

Other and further objects of the present invention will become more readily apparent from the following detailed description of a preferred embodiment of the present invention when taken in conjunction with the drawings, in which.

Although the methods of the present invention relate to the masking of areas on a semiconductor body without regard to the size or shape of the areas, the outstanding and highly unusual nature of the method is better appreciated when considered in its application to the masking of minute and/or intricate or irregularly shaped areas. Thus, there are many instances in the fabrication of semiconductor devices where it is desirable to mask a precisely defined minute area of the semiconductor with an etch-resistant material so that all of the undesired area remains unprotected and can be etched away. In order to afford fullest understanding of the present invention, one such instance will be specifically mentioned by way of illustration. It will be appreciated, of course, that the invention is not limited to this example, but in its broadest aspects encompasses the precision masking of any size or shape area on a semiconductor body for any purpose.

Figure 1:
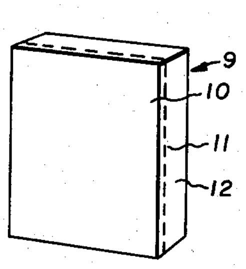
Fig. 1 is a perspective view of a semiconductor slice characterized by a diffused junction.

A typical illustration is shown in Figs. 1 through 5 portraying one version of a typical technique for producing a high frequency transistor. The starting point of the technique is a semiconductor slice, such as a germanium slice as illustrated in Fig. 1, and identified generally by the numeral 9. The semiconductor material contains an active impurity, such as a p type conductivity producing impurity, and has diffused into one surface 10 thereof an active impurity of the opposite type in sufficient quantity to convert the surface region of the slice into material of said opposite type conductivity. The diffusion technique used to produce this structure is conducted in accordance with the accepted practices and continues for a sufficient time at the proper temperature to produce a diffused layer of a thickness which is typical, for example, about $\frac{1}{10}$ mil. Thus, the resulting structure is a slice of semiconductor material having a thin diffused layer 10 of one conductivity type, a p-n junction 11, and a portion 12 retaining the original type conductivity which is opposite that of the diffused layer 10. Subsequently, it is necessary to establish on this structure a matrix of contacts and additional junction areas whereby a large number of transistor devices may be obtained from a single slice. The above is accomplished as follows.

Figure 2:
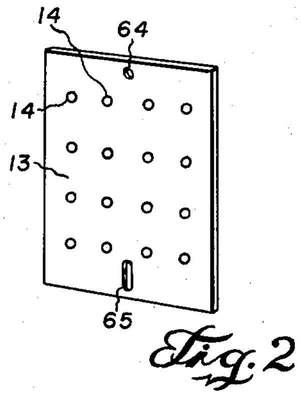
Fig. 2 is a perspective view of a stencil.
Figure 3:
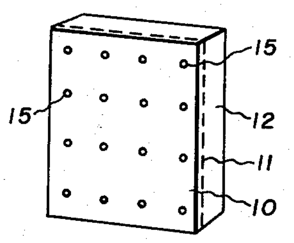
Fig. 3 is a view in perspective of the semiconductor slice of Fig. 1, after contact dots have been deposited thereon using the stencil of Fig. 2.
Figure 4:
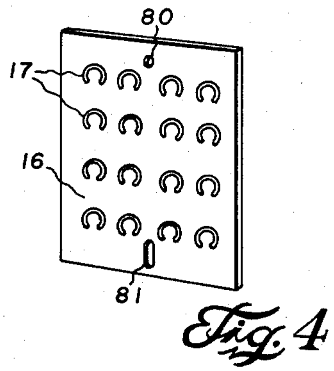
Fig. 4 is a perspective view of a second stencil.
Figure 13:
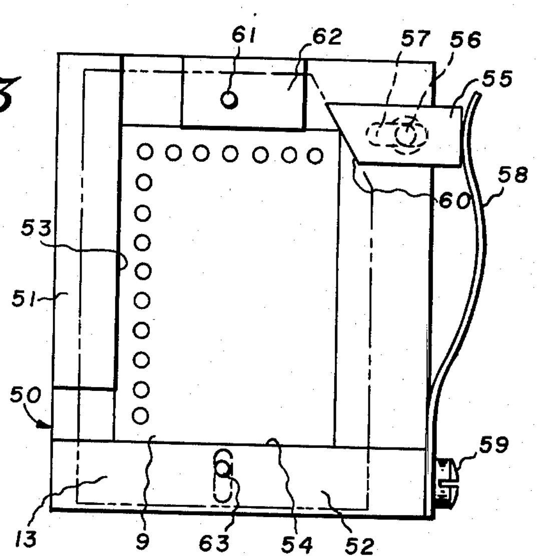
Fig. 13 is a plan view of a jig for receiving and indexing a semiconductor slice relative to the various stencils.

The slice 9 is received in a jig, as illustrated in Fig. 13, consisting of a plate 50 characterized by two raised portions 51 and 52, having edges 53 and 54, respectively, normal to each other. The slice 9 lies on the plate and it is urged against the edges 53 and 54 by means of a slider plate 55 retained by a screw 56 that rides in a slot 57 cut in plate 50 that is biased by lease spring 58 anchored at one end of plate 50 by screw 59. The end of slider plate 55 is angled as indicated at 60 to exert pressure in the necessary direction. A stencil 13, as illustrated in Figure 2, consisting of a rectangular plate of metal or other suitable material having a desired pattern of holes of proper size and shape defined therein is then positioned in the jig. The stencil 13 is shown by the dashed line for increased clarity. A pin 61 is fixed in a raised portion 62 formed on the side of plate 50 opposite the raised portion 52 which also carries a pin 63. The stencil 13 is indexed relative to slice 9 by means of a hole 64 defined in the stencil near one edge and a slot 65 near the opposite edge. The stencil is placed on the jig with pin 61 received through hole 64 and pin 63 received through hole 65. The stencil openings or cutouts are located relative to the center line of the hole 64 and slot 65 and the cutouts are each dimensioned from the hole 64, thus providing positive indexing of the stencil openings relative to the pens 61 and 62 when the stencil is placed on the jig.

Figures 14, 15:
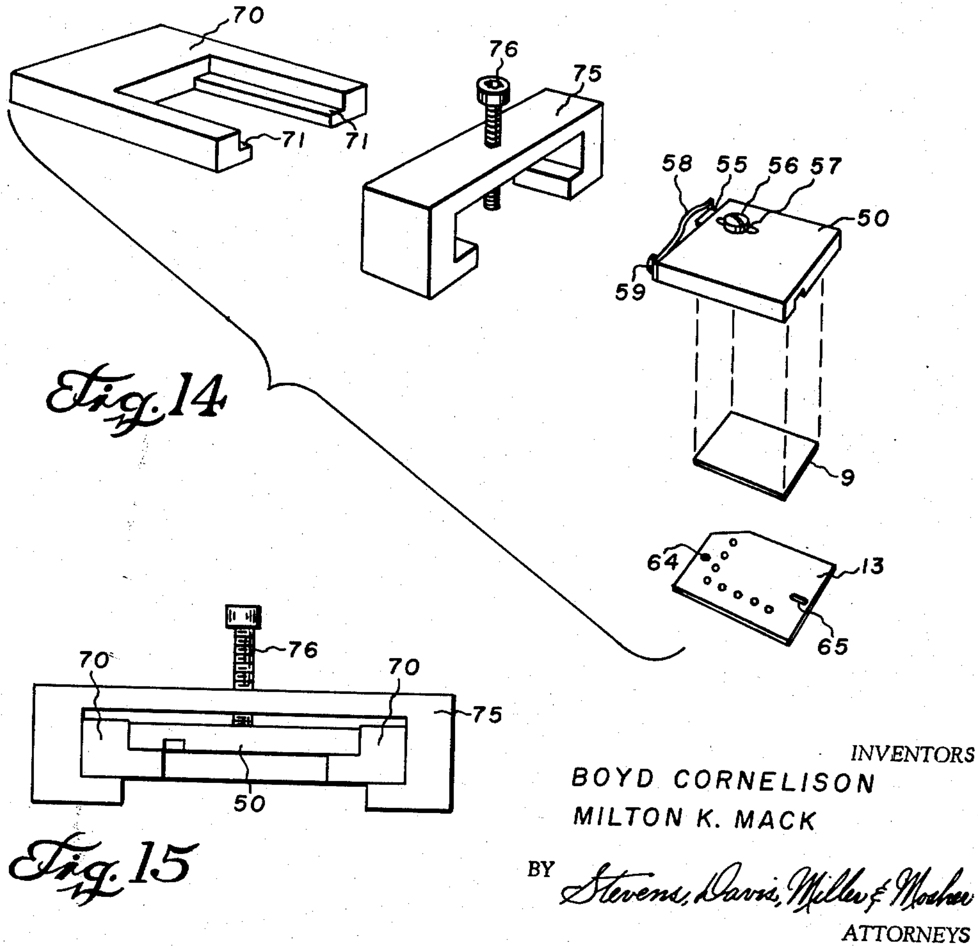
Fig. 14 is an exploded view of the assembly comprised of a stencil, semiconductor slice, jig and holder.
Fig. 15 is an end view of the components of Fig. 14 assembled.

The jig is placed stencil side down in a holder 70 consisting of a bifurcated block each leg of which defines a shelf 71. The jig is supported by shelves 71, as illustrated in Fig. 15. A clamp 75 engages the holders 70 and a bolt 76, threadedly engaged with the clamp 75, contacts the backside of the jig.

The assembly, as shown in Fig. 15, is then introduced into a suitable bell chamber, or the like, which can be evacuated. A small quantity of active impurity producing a conductivity of the same type as has been established in the region 12 is also put into the bell chamber. A suitable vacuum is pulled on the bell chamber. The temperature of the slice 9 is suitably elevated and the active impurity material is heated and evaporated and deposited through the openings 14 in the stencil 13 onto the surface 10 of the semiconductor slice 9 in accordance with well-known vacuum evaporation processes. The product of the step described above is shown in Fig. 3. The surface 10 of the slice 9 is now characterized by a pattern of small dots 15 arranged in the same geometrical pattern as the openings 14 of the stencil 13. Upon alloying the deposited impurity into the surface 10 of the slice, a p-n alloyed junction is formed under each dot.

Figure 5:
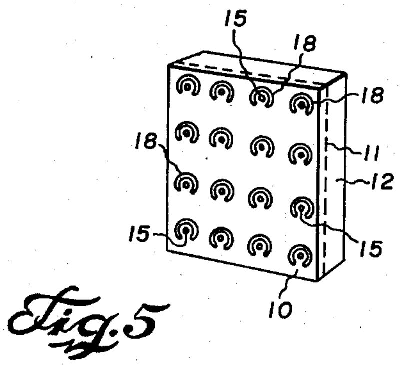
Fig. 5 is a perspective view of the semiconductor slice after material has been deposited thereon using the stencil of Fig. 4.

The assembly is then taken from the vacuum chamber and the stencil 13 is removed without disturbing the slice 9 in the jig. A second stencil, identified by the numeral 16 (see Fig. 4), having indexing holes, 81 and 82, identical to the indexing holes 64 and 65 of stencil 13, and having different shaped cutouts such as horseshoe cutouts 17, for example, which are, however, arranged in the same pattern as the holes 14, is placed over the pins 61 and 62 against the slice 9. When the stencil 16 is thus placed onto the jig, each horseshoe shaped cutout 17 surrounds a dot 15. The assembly as shown in Fig. 15, but with stencil 16 replacing stencil 13, and a small quantity of gold containing a small percentage of an impurity producing conductivity of the same type as that of region 10 are placed into a bell chamber and a suitable vacuum pulled on the chamber. The gold with the active impurity contained therein is vacuum evaporated and deposited through the openings 17 of stencil 16 onto the horseshoe shaped exposed areas of the surface 10 of the slice 9. The resulting structure is as illustrated in Fig. 5 and consists of the structure of Fig. 3 plus the addition of a horseshoe shaped ribbon or strip 18 surrounding each dot 15. The dots 15 constitute the emitters and the horseshoe shaped areas 18, when alloyed, constitute the base contacts for the transistors to be cut from this slice.

Figure 7:
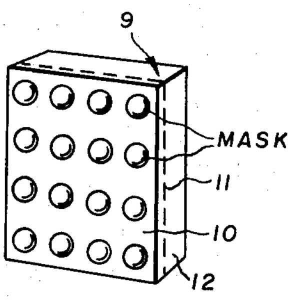
Fig. 7 is a perspective view of a semiconductor slice after etch resistant masking material has been deposited thereon using the stencil of Fig. 6.
Figure 8:
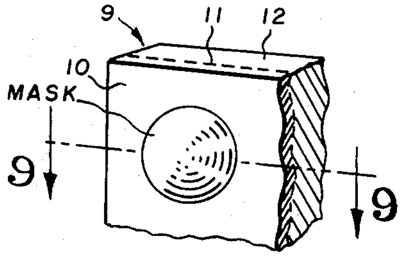
Fig. 8 is an enlarged perspective view, broken away, showing one of the treated areas of the semiconductor slice.
Figure 9:
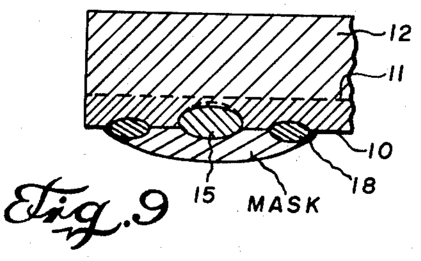
Fig. 9 is a view in section taken along line 9—9 of Fig. 8.

In order to produce high frequency characteristics in the resulting transistor devices, it is desirable to have the base collector junction of each device confined to an extremely small area. This limitation of the junction area is advantageously achieved at this stage in the fabrication by masking the contacts 15 and 18 on the slice 9, as shown in Fig. 7, and etching away unmasked areas to a depth below junction 11. The slice 9 is thereafter cut into individual transistor units to be mounted in a header. The high frequency response of the resulting transistor units is dependent, in part, upon the extent of the junction area remaining. In order to achieve ultimate high frequency response of units of this type, it is generally believed that this condition is met only when the junction area remaining is that area directly beneath the base and emitter contacts. Although the optimum structure has long been recognized, it has been unobtainable uniformly through use of present masking techniques due to the inability to control and limit the extent of the area masked. Accordingly, by present masking practices, the dot 15 and contact 18 combinations must be individually masked one at a time by hand by applying to them a quantity of masking solution by means of a wire or brush or by applying to them a solid, such as wax, and heating the structure to flow the masking material. By either of these methods, the masking material is liquid during its application and flows in a largely uncontrolled manner in a generally radial pattern. Hence, whenever it is desired to mask a small area such as the one illustrated, or an irregularly shaped area, excess or parasitic areas are unavoidably included. The inability to control the extent of masking, using these methods, results in a lack of uniformity of the finished units and inability to predict or control performance of the units. Further, contacts of this type are frequently made much larger than necessary in order to facilitate the manual masking of the units.

Figure 6:
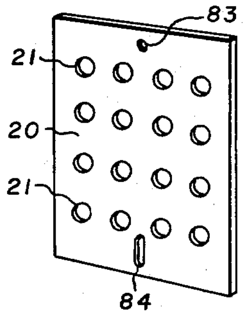
Fig. 6 is a perspective view of a third stencil.

Despite the recognized inadequacies of these masking techniques, and the need for a method for precision masking, the art has been unable to develop a satisfactory masking technique until the present invention. The aforesaid inadequacies have been overcome by the present invention which for the first time offers a practical method for precision masking. It has been discovered that unexpectedly excellent results can be obtained by depositing masking material from its vapor phase through a stencil to precisely and accurately controlled areas. Such a stencil means 20 which has been especially adapted for use in the transistor manufacturing process here used for illustration is shown in Fig. 6. The stencil means 20 has a hole 83 and a slot 84 identical to the holes 64 and 80 and slots 65 and 81 of stencils 13 and 16, respectively. The stencil 20 also has cutouts 21 arranged in the same pattern as the cutouts in the other stencils and these cutouts are likewise dimensioned from the indexing hole 83 and slot 84. The cutouts 21 are exactly shaped and sized for the proper precision masking of the contact configuration shown in Fig. 5.

Thus, whereas in the prior art when the units had reached the stage of manufacture illustrated in Fig. 5, slice 9 was removed from the jig for manual masking, by the present invention slice 9 is retained in the jig and the masking material vapor deposited onto the slice 9 in the exact areas desired to be protected through the agency of the stencil 20.

Returning, then, to the illustrative manufacturing process, and describing the masking step to be employed according to the present invention, upon the removal of the assembly of Fig. 15 from the vacuum chamber after depositing the contacts 18 onto the slice 9, the stencil 16 is removed from the assembly and replaced by stencil 20, again without disturbing the slice 9. This assembly, together with a quantity of the masking material to be used, the preferred material being sulfur, is then again placed in the bell chamber which is evacuated. When sulfur is the masking material to be used, the vacuum of the chamber should be approximately $5\times10^{-3}$ mm. of mercury. Sufficient heat is then applied to vaporize the masking material, in this instance the sulfur, which is deposited upon the areas of the semiconductor slice 9 exposed through the cutouts 21. The masking material deposited in this manner forms a protective mask coating each of the horseshoe shaped strips 18 and the area within each strip 18 including the dot 15. The resulting article is shown in Fig. 7.

It should be noted at this point that when sulfur is deposited in this manner a porous coating is formed. However, this porous sulfur coating may be thereafter transformed into a non-porous etch resistant seal or mask by heating the sulfur to its fusion point. By controlling the heat applied to fuse the sulfur or other masking material the masking material can be fused to form a non-porous material before the material begins to flow and cover or mask portions of the semiconductor outside the desired area.

A further property of sulfur rendering it unusually advantageous for use as the masking material of the present invention is its affinity for gold. It has been found that, unexpectedly, sulfur in its liquid state is attracted to and will draw itself on top of any gold deposits or contacts on the semiconductor material. Thus sulfur may be deposited in almost any manner on or even near a gold alloyed area on a semiconductor slab and upon heating the sulfur above its fusion point to the temperature at which it flows, the sulfur will form itself onto the gold area on coming in contact therewith. The sulfur forms on the gold area in the exact shape of the area to the exclusion of the semiconductor material outside of the gold area. Through the use then, of sulfur as the masking material in the transistor manufacturing process described herein by way of illustration, the use of a stencil to accurately deposit the masking material is unnecessary. For example, precision masking of the contact area of the transistor units of Figure 5 have been successfully accomplished by depositing sulfur, either in solution or as a powder, on each contact area in an amount sufficient to cover the area. No attempt was made to confine the sulfur thus deposited within the precise area to be masked. The slab was then heated to the temperature at which the sulfur liquified and flowed. On melting, the sulfur formed itself into a mask precisely covering the contact area to the outside edge of the gold contact. (The surface tension of the liquid sulfur caused it to bridge the open end of the horseshoe and to cover the area encircled by the gold contact.) Thus it can be seen that this unusual and unexpected property of sulfur as a masking material allows an extremely simple procedure for the precision masking of gold covered or gold outlined areas on semiconductors.

Although the sulfur has been described as the preferred material in the method of the present invention, since it has outstanding properties and gives rise to unexpected results, nevertheless it will be recognized that other materials may be used for this purpose, including polyethylene, polystyrene, beeswax and selenium. In the event the masking material deposit is a non-porous coating, subsequent heating of the coating may be dispensed with.

After each strip 18 and dot 15 combination has been coated with protective material (sulfur), the slice 9 is removed from the vacuum chamber and heated to render the coating non-porous and is subjected to an etching treatment. Any suitable etch may be employed for removing the unprotected exposed areas of the semiconductor slice 9. Thus, for example, CP 4 may be used. The particular etch named is essentially a nitric acid-hydrofluoric acid etch. Various materials may be added to the essential material such as bromine, acetic acid, iodides, etc. for various known purposes.

Figure 10:
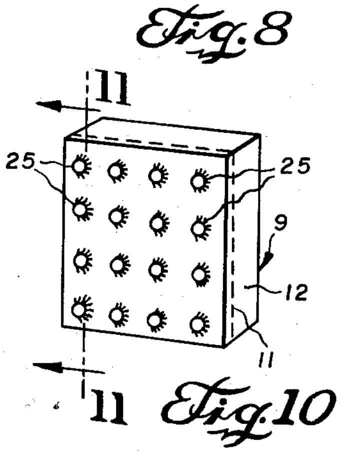
Fig. 10 is a perspective view showing the semiconductor slice after it has been subjected to an etching treatment.
Figure 11:
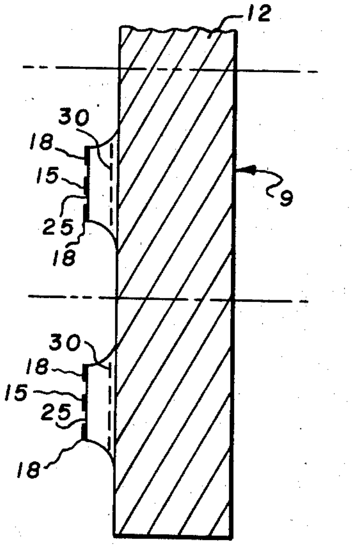
Fig. 11 is a view in section taken along line 11—11 of Fig. 10.

The semiconductor slice is etched away in areas unprotected by the sulfur coatings. Accordingly, mesas or plateaus of a precisely controlled size and shape are formed on the slice in this step of the process since the protective mask of sulfur was deposited on precisely controlled areas of the surface of the semiconductor slice 9. The plateaus are illustrated in Figs. 10 and 11 and have been generally designated by the numeral 25. The etching of the semiconductor slice is to a depth below the junction 11 to rid the structure of that diffused junction except in those areas protected by the sulfur. Consequently, a plurality of diffused junctions 30 result, one in each of the plateaus 25 with each junction 30 substantially equal in diameter to the diameter of the sulfur covered areas. Thereafter, to remove the sulfur masking, the slice 9 is placed into a suitable furnace and heated to a temperature of about 150° C. for a period of about six minutes until all of the sulfur sublimes. The sublimation process of removing the sulfur avoids the necessity of further cleaning treatments to remove residues left by the solvents previously used to remove masking materials. Herein lies one of the unique and unexpected advantages in using sulfur as a masking material.

Figure 12:
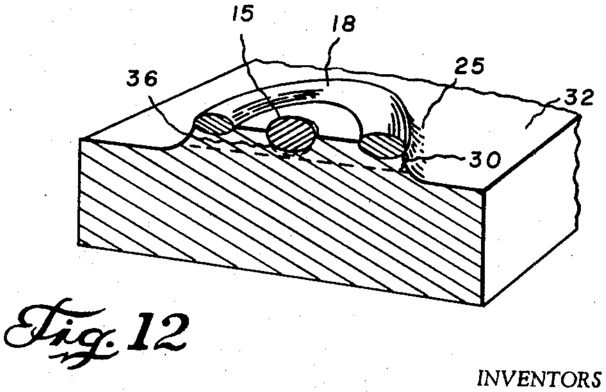
Fig. 12 is a perspective view, partly in section, taken along the middle of one of the resulting transistor devices produced by the method of the invention.

The semiconductor slice 9 is then cut up, as indicated in Fig. 11, into a plurality of individual transistor devices, one of which is shown in Fig. 12. The resulting product consists of a wafer 32, the main body of which constitutes the collector region of the transistor, a mesa 25 formed on the wafer defining a diffused base collector junction 30 of precisely controlled area, a base contact 18, an alloyed base-emitter junction 36, and an emitter contact 15.

As a result of the precision masking technique of the present invention, the manufacturing processes for many semiconductor devices have been greatly improved. For example, the particular device resulting from the manufacturing process used herein to illustrate the present invention would be impossible to construct with any degree of success without the precision masking technique herein disclosed. Whereas, using the precision masking process of the present invention, devices of this type are produced on a large commercial scale with a phenomenally low rejection rate. Further, these devices exhibit excellent frequency response characteristic and can be produced with a uniformity of performance heretofore unheard of.

Thus, there has been described herein new techniques and materials for masking objects and devices which are to be subjected to treatment by an etching process. Although the present invention has been shown and described in terms of a specific embodiment and its practice illustrated in connection with a specific manufacturing process, nevertheless various changes and modifications obvious to one skilled in the art from a knowledge of the teachings and concepts advanced herein and the application of these techniques and materials to other manufacturing processes are deemed to fall within the spirit, scope and contemplation of the invention.

What is claimed is:

1. The method of treating a sample of semiconductor material comprising the steps of placing a stencil over said sample, evaporating sulphur through said stencil onto said sample, subjecting said sample to an etching treatment, and thereafter removing said sulphur.

2. The method of treating a sample of semiconductor material comprising the steps of depositing sulphur onto said sample in a desired pattern, subjecting said sample to an etching treatment and thereafter removing said sulphur by heating said sulfur to its point of vaporization.

3. The method of treating a sample of semiconductor material comprising the steps of placing a stencil over said sample, evaporating sulfur through said stencil onto said sample, heating the deposited sulfur to form a non-porous mask, subjecting said sample to an etching treatment and thereafter removing said sulfur by heating said sulfur to its point of vaporization.

4. The method of treating a sample of semiconductor material comprising the steps of placing a stencil over said sample, placing said sample with the stencil thereon in a vacuum chamber together with a quantity of sulfur, evacuating the atmosphere from said chamber, heating said sulfur until said sulfur vaporizes and is deposited on said sample, heating the sulfur thus deposited to form a non-porous mask, subjecting said sample to an etching treatment and thereafter removing said sulfur by heating said sulfur to its temperature of vaporization.

5. The method of masking a sample of semiconductor material preparatory to etching comprising the steps of alloying a small quantity of gold into said sample in a pattern at least partially outlining the area of said sample desired to be masked, depositing sulfur onto said sample and heating said sulfur to form a non-porous mask.

6. The method of masking a sample of semiconductor material as defined in claim 5 wherein said sulfur is deposited on said sample in contact with said gold alloyed to said sample at at least one point.

7. The method of masking a sample of semiconductor material as defined in claim 5 wherein said sulfur is vapor deposited on said sample.

8. The method of masking a sample of semiconductor material as defined in claim 5 wherein said sulfur is deposited on said sample in the form of a solution.

9. The method of masking a sample of semiconductor material as defined in claim 5 wherein said sulfur is deposited on said sample in the form of a powder.

10. The method of masking a sample of semiconductor material as defined in claim 5 wherein said sulfur is deposited on said sample in the form of a liquid.

11. The method of masking a sample of semiconductor material as defined in claim 5 wherein said sulfur is deposited on said sample in the form of a solid.

References Cited in the file of this patent

UNITED STATES PATENTS

| | | |
|---|---|---|
| 2,560,594 | Pearson | July 17, 1951 |
| 2,695,852 | Sparks | Nov. 30, 1954 |
| 2,780,569 | Hewlett | Feb. 5, 1957 |
| 2,906,648 | Kohl | Sept. 29, 1959 |